(12) United States Patent
Fortin et al.

(10) Patent No.: US 10,131,999 B2
(45) Date of Patent: Nov. 20, 2018

(54) METHOD FOR PRODUCING A SILICON INGOT HAVING SYMMETRICAL GRAIN BOUNDARIES

(71) Applicant: COMMISSARIAT A L'ENERGIE ATOMIQUE ET AUX ENERGIES ALTERNATIVES, Paris (FR)

(72) Inventors: Gautier Fortin, Saint-Baldoph (FR); Vanessa Amaral De Oliveira, Villeurbanne (FR); Denis Camel, Chambery (FR); Etienne Pihan, La Motte Servolex (FR)

(73) Assignee: COMMISSARIAT À L'ENERGLE ATOMIQUE ET AUX ENERGIES ALTERNATIVES, Paris (FR)

( * ) Notice: Subject to any disclaimer, the term of this patent is extended or adjusted under 35 U.S.C. 154(b) by 281 days.

(21) Appl. No.: 14/894,380

(22) PCT Filed: May 26, 2014

(86) PCT No.: PCT/IB2014/061724
§ 371 (c)(1),
(2) Date: Nov. 27, 2015

(87) PCT Pub. No.: WO2014/191900
PCT Pub. Date: Dec. 4, 2014

(65) Prior Publication Data
US 2016/0122897 A1    May 5, 2016

(30) Foreign Application Priority Data
May 27, 2013   (FR) ...................................... 13 54761

(51) Int. Cl.
*C30B 11/14*   (2006.01)
*B28D 5/04*    (2006.01)
(Continued)

(52) U.S. Cl.
CPC ................ *C30B 11/14* (2013.01); *B28D 5/04* (2013.01); *B28D 5/045* (2013.01); *C30B 11/002* (2013.01); *C30B 15/00* (2013.01); *C30B 29/06* (2013.01)

(58) Field of Classification Search
CPC ....... C30B 11/002; C30B 11/14; C30B 15/00; C30B 29/06; B28D 5/04; B28D 5/045
(Continued)

(56) References Cited

U.S. PATENT DOCUMENTS

| 2001/0020437 A1* | 9/2001 | Falster ................... C30B 15/00 117/13 |
| 2002/0170485 A1* | 11/2002 | Falster ................... C30B 15/00 117/13 |

(Continued)

FOREIGN PATENT DOCUMENTS

| CN | 102 747 417 A | 10/2012 |
| DE | 10 2011 086669 A1 | 5/2013 |

(Continued)

OTHER PUBLICATIONS

Fujiwara et al., "Growth of Structure-Controlled Polycrystalline Silicon Ingots for Solar Cells by Casting," Ada Materialia, 2006, vol. 54, pp. 3191-3197.

(Continued)

*Primary Examiner* — Eileen Morgan
(74) *Attorney, Agent, or Firm* — Oliff PLC

(57) ABSTRACT

A method for producing a silicon ingot, provided with symmetrical grain boundaries, including at least steps made of: (i) providing crucible with longitudinal axis, bottom of which includes a paving formed from monocrystalline cuboid silicon seeds with a square or rectangular base and arranged contiguously, the paving, when viewed according to axis, being in shape of a grid of orthogonal directions (x)

(Continued)

and (y) parallel to edges of seeds; and (ii) proceeding with controlled solidification of silicon by growth on seeds in a growth direction collinear to axis; wherein paving in step (i) is produced from identical silicon seeds, with two seeds contiguous in direction (x) being images of each other by turning axis (y) and two seeds contiguous in direction (y) being images of each other by turning axis (x), and misorientation 2θ between crystalline arrays of two contiguous seeds being greater than 4°.

10 Claims, 5 Drawing Sheets

(51) Int. Cl.
    *C30B 15/00*     (2006.01)
    *C30B 11/00*     (2006.01)
    *C30B 29/06*     (2006.01)

(58) Field of Classification Search
    USPC .......................................................... 125/12
    See application file for complete search history.

(56) References Cited

U.S. PATENT DOCUMENTS

| | | | |
|---|---|---|---|
| 2009/0047203 A1* | 2/2009 | Mueller | C30B 11/14 |
| | | | 423/348 |
| 2010/0192838 A1 | 8/2010 | Stoddard | |
| 2010/0193664 A1 | 8/2010 | Stoddard | |
| 2010/0193989 A1 | 8/2010 | Stoddard | |
| 2010/0197070 A1 | 8/2010 | Stoddard et al. | |
| 2013/0095028 A1 | 4/2013 | Lan et al. | |
| 2013/0233239 A1* | 9/2013 | Oriwol | C30B 11/02 |
| | | | 117/81 |

FOREIGN PATENT DOCUMENTS

| | | | |
|---|---|---|---|
| DE | 10 2012 102597 A1 | 9/2013 | |
| EP | 1209259 A2 * | 5/2002 | ............. C30B 15/00 |
| WO | 2007/084934 A2 | 7/2007 | |
| WO | 2009/014963 A1 | 1/2009 | |

OTHER PUBLICATIONS

Takahashi et al., "Generation Mechanism of Dislocations During Directional Solidification of Multicrystalline Silicon Using Artificially Designed Seed," Journal of Crystal Growth, 2010, vol. 312, pp. 897-901.

Kutsukake et al., "Influence of Structural Imperfection of Sigma5 Grain Boundaries in Bulk Multicrsyalline Si on their Electrical Activities," Journal of Applied Physics, 2007, vol. 101, pp. 063509-1 thru 063509-5.

Jul. 7, 2014 International Search Report issued in International Patent Application No. PCT/IB2014/061724.

Jul. 7, 2014 Written Opinion issued in International Patent Application No. PCT/IB2014/061724.

* cited by examiner

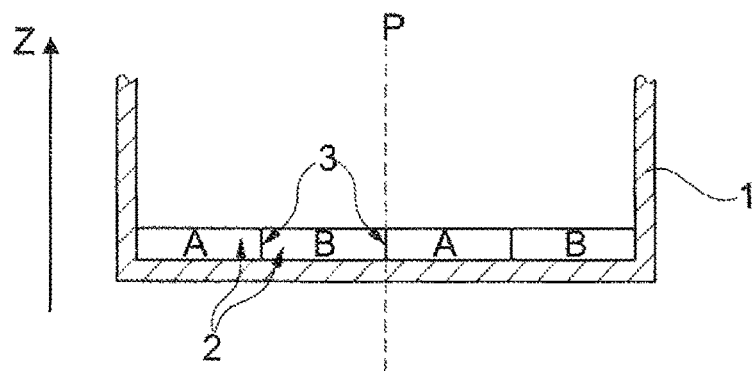
Fig. 1a
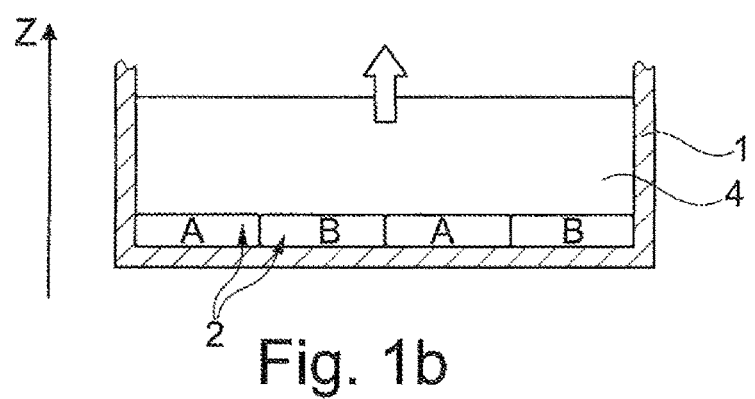
Fig. 1b
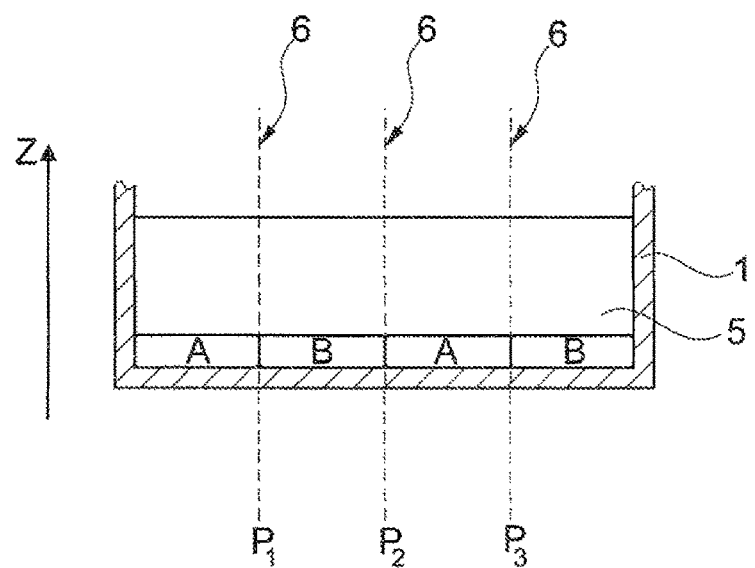
Fig. 1c
Fig. 1

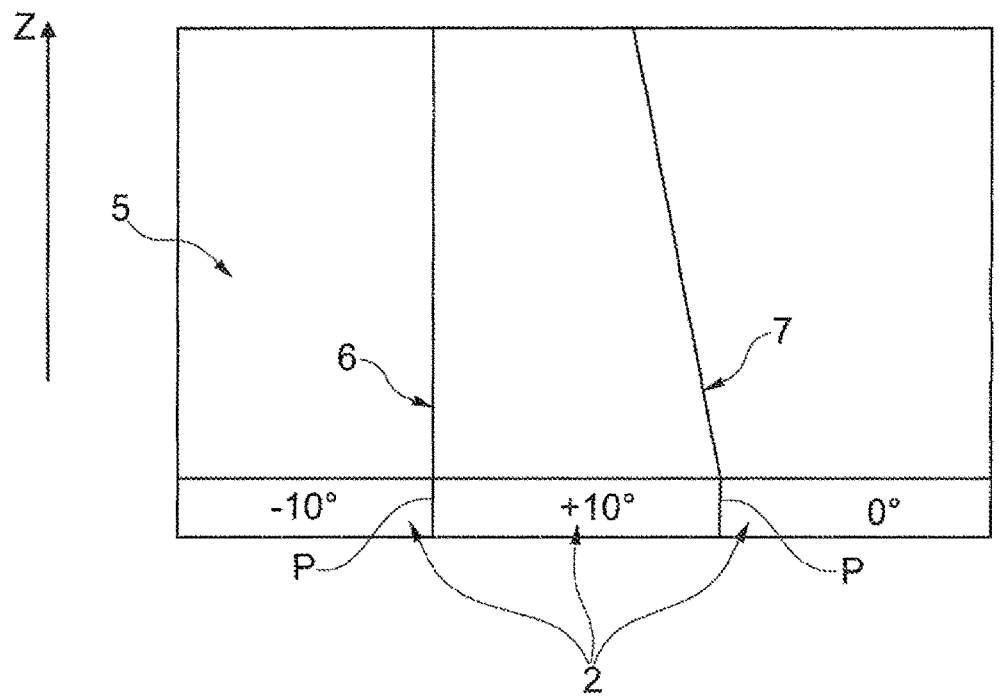
Fig. 6a
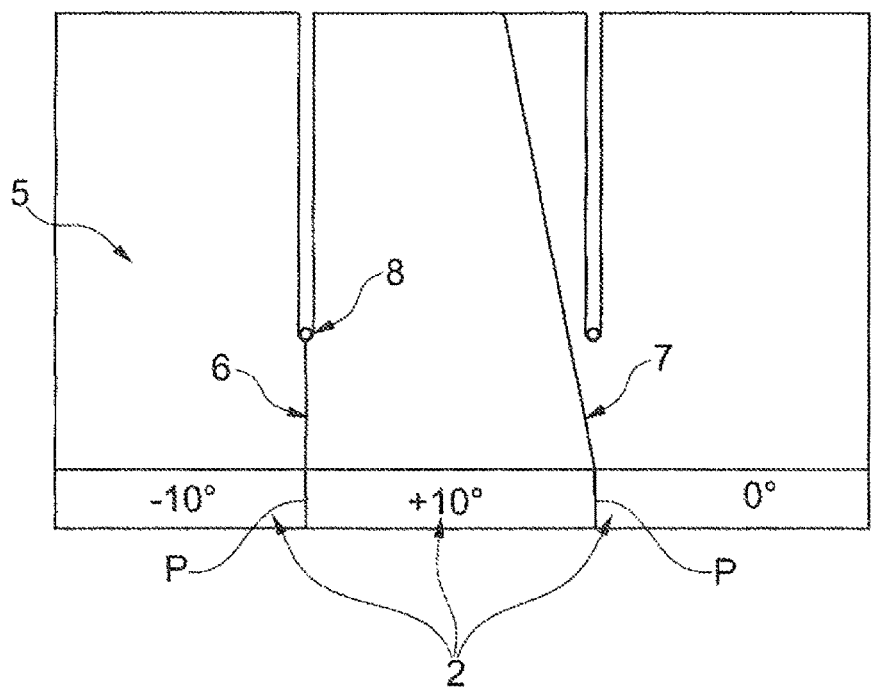
Fig. 6b
Fig. 6

METHOD FOR PRODUCING A SILICON INGOT HAVING SYMMETRICAL GRAIN BOUNDARIES

The present invention relates to a novel process for manufacturing a silicon ingot, having symmetrical grain boundaries. In particular, such an ingot may be advantageously dedicated to giving, by cutting, monocrystalline silicon wafers free of grain boundaries.

Such wafers are particularly advantageous in the context of the production of photovoltaic cells and modules.

Currently, photovoltaic cells are predominantly manufactured from monocrystalline or multicrystalline silicon. The commonest chain of production of crystalline silicon employs the solidification of ingots from a bath of liquid silicon. These ingots are then cut into wafers which may be converted into photovoltaic cells.

Multicrystalline silicon ingots are conventionally produced by melting a silicon feedstock, followed by a directional solidification. This technique advantageously makes it possible to crystallize large volumes of silicon; and the size of the ingots manufactured may be adjusted by varying the dimension of the crucibles.

Unfortunately, this highly productive process has a major drawback with regard to the crystalline structure of the silicon ingots thus produced. In fact, this technique results in ingots that have a crystalline structure characterized by a very large number of different crystalline orientations and grains, but also by a high density of dislocations, these dislocations being distributed inhomogeneously in the ingot. Consequently, this process is not effective for obtaining a monocrystalline-like, referred to as "mono-like", silicon ingot, that is to say a silicon ingot consisting very predominantly (especially of more than 90%) of monocrystalline material.

Several years ago, techniques were developed to produce mono-like silicon ingots by directional solidification with improved crystalline structures, especially via a better control of the nucleation, as described in the document by Fujiwara et al., Growth of structure-controlled polycrystalline silicon ingots for solar cells by casting, Acta Materialia, 54 (2006), 3191-3197, or else via the use of monocrystalline seeds covering the bottom of the solidification mold, as proposed in documents WO 2007/084934, US 2010/0192838, US 2010/0193989, US 2010/0193664, WO 2009/014963, US 2010/0197070 and US 2013/0095028.

However, the use of monocrystalline seeds is not sufficient for the growth to be free of defects. Indeed, in order to produce a mono-like ingot adapted to industrial crucible sizes, it is necessary to add several seeds to the bottom of the crucible. Unfortunately, the seeds, thus positioned next one another in the bottom of the crucible, create, depending on their dimensions and their respective disorientations, numerous seed boundaries, which are sources of defects in the mono-like ingots. Indeed, the seed boundaries present in the tiling at the bottom of the crucible are behind the formation of grain boundaries, which may not be parallel to the crystallization direction, and in the vicinity of which dislocations and sub-boundaries may develop in the mono-like ingot obtained by directional solidification by seeded regrowth.

Thus, the propagation of the grain boundaries from the initial position of the seed boundaries in the silicon ingot is in no way controlled. These crystalline defects may therefore be located at various locations in the mono-like ingot formed, and therefore in the silicon wafers resulting from the cutting of this ingot into bricks.

Furthermore, the dislocations and sub-boundaries accumulated around these boundaries reduce the photovoltaic characteristics (current, shape factor, voltage) of the cells produced with materials containing them and, consequently, may prove particularly prejudicial with regard to the efficiency of the photovoltaic cell that will be formed from such a wafer.

Consequently, there remains a need to provide a method of producing a mono-like silicon ingot that makes it possible to overcome the aforementioned drawbacks.

The present invention aims specifically to meet this need.

More particularly, it proposes a novel process for forming a mono-like silicon ingot that makes it possible to control the propagation of the grain boundaries over the entire height of the ingot.

The present invention thus relates, according to a first of its aspects, to a process for manufacturing a silicon ingot, having symmetrical grain boundaries, comprising at least the steps consisting of:

(i) providing a crucible of longitudinal axis (Z), the bottom of which comprises a tiling formed from monocrystalline silicon seeds of straight prism shape; and (ii) carrying out the directional solidification of silicon by seeded regrowth in a growth direction collinear to the axis (Z);

characterized in that the tiling in step (i) is formed from two types of seeds A and B of different crystalline orientations and that are positioned in a contiguous and alternate manner, a seed A having a crystal lattice symmetrical to the crystal lattice of an adjacent seed B, relative to the plane P defined by the boundary between said seeds A and B.

In particular, the process according to the invention may be such that:

all or some of the seeds are of rectangular- or square-based straight block shape, the tiling of the seeds is in the form of a grid, in particular divided into squares or into rectangles, the disorientation 2θ between the crystal lattice of a seed A and the crystal lattice of an adjacent seed B is greater than 4°, in particular greater than or equal to 5°, and more particularly between 6° and 45°, and with the tiling being obtained from identical seeds, the seed B being obtained from a seed A that has undergone a rotation of an angle of 180° about one of the vectors perpendicular to the side faces of the seed.

According to one particularly preferred embodiment, the process of the invention comprises at least the steps consisting of:

(i) providing a crucible of longitudinal axis (Z), the bottom of which comprises a tiling formed from monocrystalline silicon seeds of square- or rectangular-based straight block shape, said monocrystalline silicon seeds being positioned contiguously, said tiling seen along the axis (Z) being in the form of a grid having orthogonal directions (x) and (y) parallel to the edges of the seeds; and (ii) carrying out the directional solidification of silicon by seeded regrowth in a growth direction collinear to the axis (Z);

characterized in that the tiling in step (i) is produced from identical silicon seeds, with two adjacent seeds along the direction (x) being images of one another by a turning over in axis (y) and two adjacent seeds along the direction (y) being images of one another by a turning over in axis (x), and the disorientation 2θ between the crystal lattices of two adjacent seeds being greater than 4°.

The expression "turning over in axis (T)", also referred to as orthogonal symmetry of axis (T), is understood to mean a rotation of 180° about the axis (T).

In other words, two adjacent seeds of a tiling according to the invention, denoted by seed A and seed B, are such that the seed B is obtained from a seed A that has undergone a rotation of an angle of 180° about one of the vectors perpendicular to the side faces of the seed, that is to say within the context of a tiling in the form of a grid, about the axis (x) or (y).

As explained in detail in the remainder of the text, such an embodiment advantageously makes it possible to guarantee the symmetry of the crystal lattices of two adjacent seeds A and B, relative to the plane P defined by the boundary between said seeds, without it being necessary to resort to crystallographic orientation measurements.

In the remainder of the text, and unless otherwise indicated, a seed and/or ingot and/or wafer, defined subsequently, are characterized for the orthogonal frame of reference of axes (x), (y) and (z), corresponding to the three main directions, respectively of the seed, of the ingot or of the wafer. Preferably, the axis (z) of a seed and/or of an ingot is collinear to the longitudinal axis (Z) of the crucible. In the case of a grid-type tiling, the directions (x) and (y) also correspond to the directions parallel to the lines of the grid, also referred to subsequently as "tiling directions".

The longitudinal axis of the crucible denotes the line joining all of the barycenters of the cross sections of said crucible (walls of the crucible included). The longitudinal axis may more particularly be an axis of symmetry for the crucible.

The expression "symmetrical grain boundary" is understood to denote a planar grain boundary, present in the silicon ingot formed at the end of the directional solidification of the silicon, and defining a plane of crystalline symmetry for the crystal lattices located on either side of this plane. Preferably, the plane of a symmetrical grain boundary comprises an axis collinear to the axis (Z) of the crucible.

The expression "straight prism shape" is of course understood to mean a shape approximately of straight prism type. In particular, the seeds of the paving at the bottom of the crucible have side walls that are vertical or substantially vertical (deviation of ±5°). Furthermore, the surfaces of the seeds are approximately planar, except for surface irregularities.

The overall planar surface of the seed facing the bottom of the crucible will be denoted in the remainder of the text as being the "base of the seed".

As described in detail subsequently, the base of the seeds may be of varied shape, in particular of square or rectangular or else parallelogram shape. Preferably, it is of square or rectangular shape, the seeds being then approximately of straight block shape.

According to another of its aspects, the present invention relates to a silicon ingot, having symmetrical grain boundaries, which is obtained according to such a process.

As illustrated in the following example, since the position of the grain boundaries is thus controlled during the manufacture of the ingot according to the process of the invention, it is possible to eliminate these grain boundaries, according to one embodiment variant, during the cutting of the ingot into bricks. Thus, the silicon wafers formed from these bricks are advantageously free of grain boundaries.

Thus, according to yet another of its aspects, the present invention relates to a process for manufacturing monocrystalline silicon wafers that are free of grain boundaries, comprising a step of cutting a silicon ingot as defined previously, into bricks, along the planes P.

Other features, advantages and methods of application of the process, of the silicon ingot and wafers obtained according to the invention will emerge more clearly on reading the detailed description which follows, of the exemplary embodiment of the invention and on examining the appended drawings, in which:

FIG. 1 represents, schematically and partially, in cross section, the various steps of a process for manufacturing a silicon ingot and silicon wafers according to the invention;

FIG. 6 represents, schematically, the development of a symmetrical grain boundary (6) and of a non-symmetrical grain boundary (7), over the height of an ingot, from seeds having different crystalline orientations (FIG. 6a); and the cutting of the ingot (FIG. 6b);

It should be noted that, for reasons of clarity, the various elements in the figures are not drawn to scale, the actual dimensions of the various parts not being observed.

In the remainder of the text, the expressions "between . . . and . . . ", "ranging from . . . to . . . " and "varying from . . . to . . . " are equivalent and are intended to signify that the limits are included, unless otherwise mentioned.

Unless otherwise mentioned, the expression "containing/comprising a" should be understood to be "containing/comprising at least one".

Step (i): Tiling in the Bottom of the Crucible

As specified above, the process of the invention uses a tiling, in the bottom of the crucible, by seeds (2) of monocrystalline silicon.

According to one particular embodiment, the tiling is formed in the bottom of a conventional crucible. It is also possible to envisage crucibles, of which the bottom itself is formed of the tiling of seeds.

Preferably, the seeds tile the whole of the surface area of the bottom of the crucible (for example, in the case of a graphite crucible) or almost all of the surface area of the bottom of the crucible (for example in the case of a crucible which may be subject to a shrinkage, for example of 2%, such as silica crucibles, there remains a surface area at the bottom of the crucible that is not covered by the seeds).

According to one particular embodiment, the smallest dimension of the silicon seeds in the tiling plane is greater than or equal to 95 mm. In particular, in the case of a tiling in the form of a grid, the smallest dimension of a silicon seed along one of the directions (x) and (y) is greater than or equal to 95 mm.

As seen above, according to one particular preferred embodiment, the seeds are of square- or rectangular-based straight block shape. Such seeds advantageously enable a tiling in the bottom of the crucible in the form of a grid divided into squares or into rectangles. As explained in detail in the remainder of the text, such a tiling makes it possible to simplify the production of bricks from the ingot formed at the end of the process of the invention.

FIG. 1a represents, in cross-sectional view, a crucible (1), the bottom of which is covered with a tiling of seeds (2) in accordance with the invention.

Of course, it is up to a person skilled in the art to adjust the number of seeds forming the tiling in the bottom of the crucible, and their size, with regard to the size of the crucible used, and by taking into consideration the size of the desired silicon bricks and wafers, the diameter of the cutting wire that will be used, where appropriate, for cutting the ingot into bricks, etc.

Figure 2:
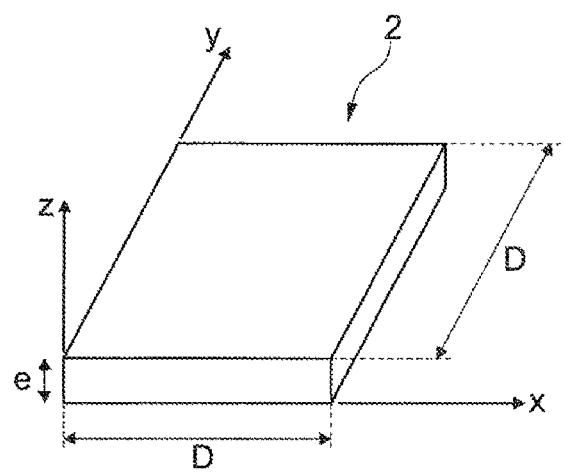
FIG. 2 represents, in 3-D view, a silicon seed of square-based straight block shape.

According to a first embodiment variant, the tiling is produced using seeds of square-based straight block shape, as represented in FIG. 2, in particular with a side (D) of a square of greater than or equal to 95 mm. As illustrated in FIG. 2, a seed is defined by three axes (x), (y), (z), defined by the edges of the seed, the axis (z) being collinear to the axis (Z) of the crucible.

By way of example, for the production of wafers of conventional 156×156 mm size, the seeds may have a square-based size of the order of 157×157 mm, as illustrated in example 1.

Figure 5:
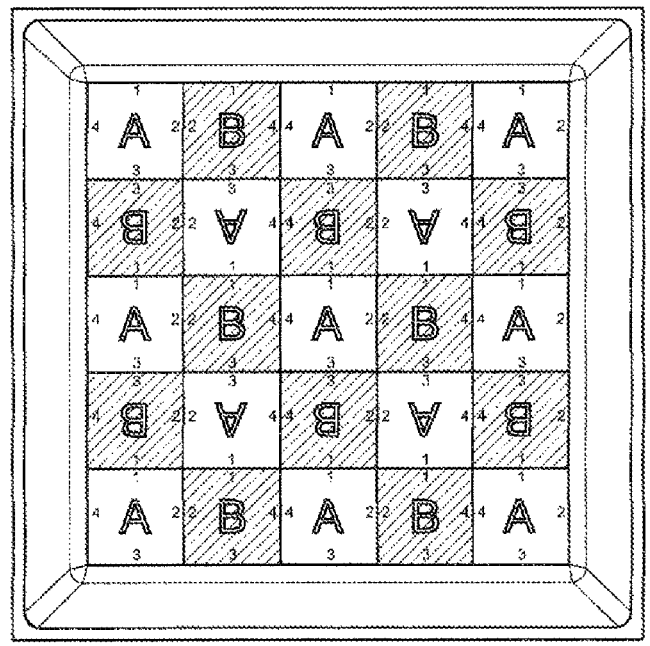
FIG. 5 represents, as a top view, a "Gen5" tiling of the bottom of the crucible, in accordance with the invention, using the seeds A and B.

Such a regular tiling of the bottom of the crucible using 5×5 square-based seeds is for example represented, as a top view, in FIG. 5.

According to a second embodiment variant, the tiling is produced using seeds of rectangular-based straight block shape, in particular having a width of greater than or equal to 95 mm and a length of greater than or equal to two times the width.

Preferably, all of the seeds forming the tiling at the bottom of the crucible have the same thickness (e) along the axis (Z).

A person skilled in the art is able to adjust the thickness (e) of the seeds used, with regard in particular to the height of the desired ingot and to the shape of the solidification front of the furnace used.

Generally, the thickness (e) is greater than or equal to 5 mm. By way of example, it may be around 25 mm.

As mentioned above, two adjacent seeds A and B in a tiling produced according to the process of the invention, as represented schematically in FIG. 5, are of different crystalline orientations, more particularly of different crystalline orientations along the axes (x) and/or (y).

Each seed A has a crystal lattice symmetrical to the crystal lattice of an adjacent seed B, relative to the plane P defined by the boundary (3) between said seeds A and B, as represented schematically in FIG. 1a.

The difference in orientation between the crystal lattices of the seeds A and B is referred to as "total disorientation". This total disorientation is expressed by a rotational operation about a disorientation axis <u v w> and having a disorientation angle 2θ. Subsequently, "total disorientation" will refer to the smallest disorientation angle 2θ among all the aforementioned rotational operations; and the "disorientation axis" will refer to the axis associated with this angle.

Preferably, the total disorientation 2θ between the crystal lattice of the seed A and the crystal lattice of the adjacent seed B is greater than or equal to 4°, in particular greater than or equal to 5°, and more particularly between 6° and 45°.

According to one particularly preferred embodiment, the crystal lattices of the seeds A and B both have a direction collinear to the axis (Z), preferably a direction <100> (or close to <100>) collinear to the axis (Z), each of the seeds advantageously being disoriented along a same angle θ relative to this direction along (x) and/or (y).

The disorientation θ of a seed may be determined by measurement methods known to a person skilled in the art, for example by measurement of the angles with the Laue method, by x-ray diffraction, or else by electron backscattered diffraction (EBSD).

According to one preferred embodiment, the disorientation between the crystal lattices of the seeds A and B takes place about an axis <001>. Preferably, the axis <001> is coincident with the axis (Z) of the crucible and/or with the axis (z) of the seed.

Such an embodiment proves particularly advantageous, with regard to the wafers that will be formed by cutting the ingot obtained from such a tiling of seeds according to the process of the invention.

In fact, the surfaces of the wafers resulting from cutting the bricks perpendicular to the surface of the ingot, along the vertical grain boundary planes, as described more specifically in the remainder of the text are, except for the cutting irregularities, substantially parallel to the planes (001). Being of (001) orientation, the surfaces of the wafers thus formed have the feature of being effectively textured by a basic texturing (based on KOH or NaOH for example). This may result in a relative gain in reflectivity of around 5 to 12% at the surface, compared to basic texturings on other orientations or to acid texturings on any orientation.

Advantageously, as mentioned above, it is possible to avoid measuring the disorientation angles θ of each of the seeds used, by easily producing the tiling according to the invention from seeds of a single type.

Thus, according to one particular embodiment, the tiling in the bottom of the crucible is produced using identical silicon seeds, the seed B being obtained from a seed A that has undergone a rotation of an angle of 180° about one of the vectors perpendicular to the side faces of the seeds, that is to say, within the context of a tiling in the form of a grid, about the axis (x) or (y).

Figure 4:
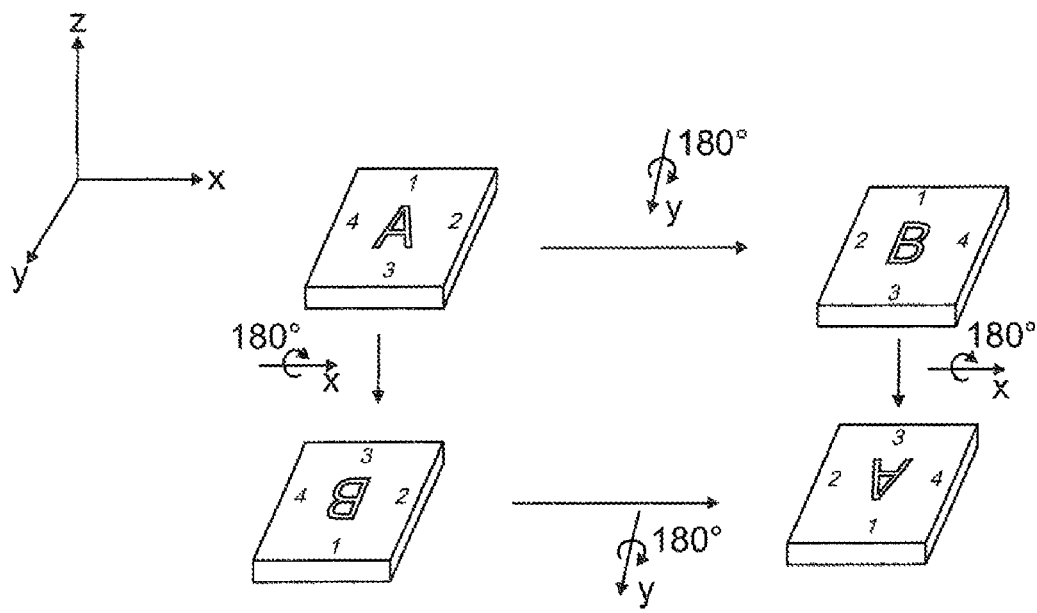
FIG. 4 represents, in 3-D view, the formation of adjacent seeds by rotation of an angle of 180° (or turning over) about the axis (y) or the axis (x)

By way of example, FIG. 4 represents the obtaining, within the context of a grid-type tiling, of two adjacent seeds in the direction (x) and two adjacent seeds in the direction (y). For example, for the production of adjacent straight block type seeds A and B along the direction (x), the seed B is obtained from a seed A by rotation of an angle of 180° (or turning over) about the axis (y).

Thus, for the production of the tiling in the direction (x) (respectively the direction (y)) with seeds A and B positioned in a contiguous and alternate manner, a seed B is obtained from a seed A by turning over in axis (y) (respectively turning over in axis (x)).

Advantageously, it is thus possible to form a tiling of seeds in accordance with the invention from identical seeds, by carrying out simple turning over operations that satisfy the conditions described above.

In particular, such an embodiment makes it possible to sidestep crystallographic orientation measurements for guaranteeing that two adjacent seeds of the tiling indeed have symmetrical crystal lattices. Since such crystallographic orientation measurements are complex to carry out, the preparation of a tiling of seeds according to this variant is simplified. In particular, the time for preparing the tiling at the bottom of the crucible may thus be reduced.

The monocrystalline silicon seeds (2) may for example be derived from a silicon ingot produced according to a Czochralski pulling technique (also referred to as a "Cz" ingot), in which technique a monocrystalline silicon seed is placed in contact with a bath of molten silicon, in order to grow a monocrystalline ingot.

This method generally provides Cz ingots of cylindrical shape. They may be machined, in a conventional manner, as represented schematically in FIG. 3, and cut into slices perpendicular to the axis ($Z_c$) of the cylinder in order to obtain seeds of straight block shape.

The pulling gives a silicon ingot with a crystallographic plane perpendicular to the axis ($Z_c$) of the ingot and that is determined by the crystalline orientation of the seed (for example <100>).

Figure 3:
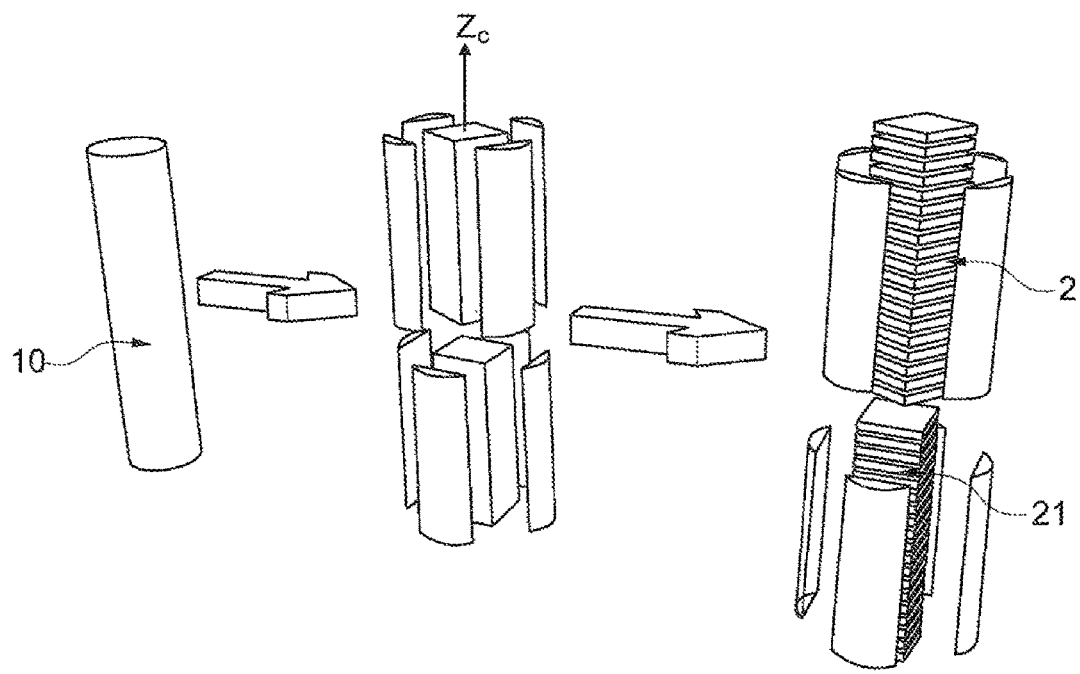
FIG. 3 represents, in 3-D view, the cutting of a Cz ingot into monocrystalline seeds (2) having a disorientation of the crystal lattice about the axis ($Z_c$)

It is then possible to manufacture seeds (2) with the desired disorientation θ of the crystal lattice, by cutting the Cz ingot with a rotation about the axis of the cylinder ($Z_c$), as represented schematically in FIG. 3.

For example, in FIG. 3, the crystal of a seed (21) (that has an imaginary and perfect cubing of the faces (i, j, k) representing the planes perpendicular to the directions <100> of the Cz ingot manufactured) does not have any disorientation with respect to the axes (x), (y) and (z) of the seed, unlike the seed (2) manufactured with a crystalline disorientation θ about the axis ($Z_c$) of several degrees. For such a seed (2), the silicon crystal is disoriented by a non-zero angle θ about the axis ($Z_c$) relative to the axes (x) and (y) of the seed, the axis (z) being collinear to the axis ($Z_c$).

Another seed (2) produced under the same conditions could then be used in order to be turned over, as represented in FIG. 4, and to form a seed of type B, adjacent to the seed A, which makes it possible to obtain a total disorientation 2θ between the crystal lattices of the adjacent seeds A and B.

According to another embodiment variant, the silicon seeds (2) originate from the recycling of an ingot produced during a previous directional solidification according to the process of the invention. More particularly, the seeds may be derived from the partial or complete removal of a horizontal slice, or the partial removal of a vertical slice, of a silicon ingot formed according to the process of the invention.

Step (ii): Formation of the Silicon Ingot

In a second step of the process of the invention, the directional solidification of silicon is carried out by seeded regrowth along a growth direction collinear to the axis (Z), as represented schematically in FIG. 1b.

A person skilled in the art is able to adjust the operating conditions for the production of the silicon ingot by directional solidification.

This may be carried out in a conventional directional solidification furnace, such as for example in a crystallization furnace of HEM (Heat Exchange Method) type or of Bridgman type with set heating at the top and the sides, which makes it possible to crystallize the silicon feedstock with a controlled temperature gradient.

Generally, the directional solidification is carried out by firstly melting a silicon feedstock in the crucible prepared in step (i). When the silicon is completely melted, and when the seeds begin to melt, the molten silicon (4) is solidified, in a directional manner, at low speed (typically from 5 to 30 mm/h).

The directional solidification may be carried out by displacement of the heating system and/or by controlled cooling, enabling a gradual displacement of the solidification front (separation front between the solid phase and the liquid phase) toward the top of the crucible, as represented schematically in FIG. 1b.

The ingot (5) obtained at the end of the directional solidification may then be cooled, in particular to ambient temperature (20° C.±5° C.).

According to one particular embodiment, the ingot (5) formed by directional solidification may have a height, measured along the growth axis (Z), of greater than or equal to 100 mm, in particular ranging from 180 to 800 mm.

Advantageously, as represented schematically in FIG. 1c, the grain boundaries propagate in the silicon ingot in a controlled manner from the seed boundaries along the planes $P_1, P_2, P_3, \ldots$ defined by the boundaries (3) between each of the adjacent seeds A and B of symmetrical crystal lattices, and perpendicular to the surface of the seeds.

By way of schematic example, FIG. 6a represents a symmetrical grain boundary (6) formed in the silicon ingot (5) from two adjacent seeds (2) in accordance with the invention, having crystal lattices symmetrical to one another ("+10°" and "−10°" seeds placed side-by-side, total disorientation of 20° along the axis (Z)), relative to the plane P defined by the boundary (3) between the seeds.

Silicon Wafers

As mentioned above, the process of the invention advantageously makes it possible to control the propagation of the grain boundaries in the ingot formed.

According to one particular embodiment, all or some of the symmetrical grain boundaries may be used to produce an identifying or esthetic marking. Such a marking may for example be useful for identifying the cells containing symmetrical grain boundaries, marking the identity of the ingot or wafer producer, or helping with the traceability in the process.

After standard trimming of the peripheral zones of the ingot, the latter may be cut into bricks.

According to a first embodiment variant, the cutting of the ingot may be carried out independently of the position of the boundary planes P ($P_1, P_2, P_3, \ldots$) defined by the boundaries between the seeds (2) of the tiling in the bottom of the crucible. The resulting bricks thus contain symmetrical grain boundaries.

According to a second embodiment variant, as represented schematically in FIG. 1c, the cutting may be carried out along the planes P ($P_1, P_2, P_3, \ldots$), defined by the boundaries between the seeds (2) of the tiling in the bottom of the crucible.

Since the grain boundaries are present in the ingot formed according to the process of the invention along the planes P, cutting the silicon ingot along these planes thus makes it possible to eliminate the grain boundaries and to advantageously obtain bricks free of grain boundaries.

The positions for cutting the ingot are easily identifiable on the ingot, insofar as they lie at the boundaries between the seeds covering the bottom of the crucible.

A person skilled in the art is able to adjust the conventional means for cutting silicon ingots into bricks in order to obtain an efficient cutting of the ingot along the grain boundaries planes P.

The cutting may be carried out with the aid of a cutting wire or else a bandsaw.

By way of example, FIG. 6b represents, schematically, the cutting of the ingot (5) along the symmetrical grain boundary (6), with the aid of a cutting wire (8).

For an ingot produced from a grid-type tiling of seeds, the cutting may for example be carried out using a conventional machine of "squarer" or bandsaw type.

It is up to a person skilled in the art to adapt the pitch of the wire guide, with regard to the size of the tiling seeds used and the diameter of the cutting wires used, so that the cutting with the squarer takes place along each of the planes P and makes it possible to eliminate the symmetrical grain boundaries of the ingot.

Figure 7:
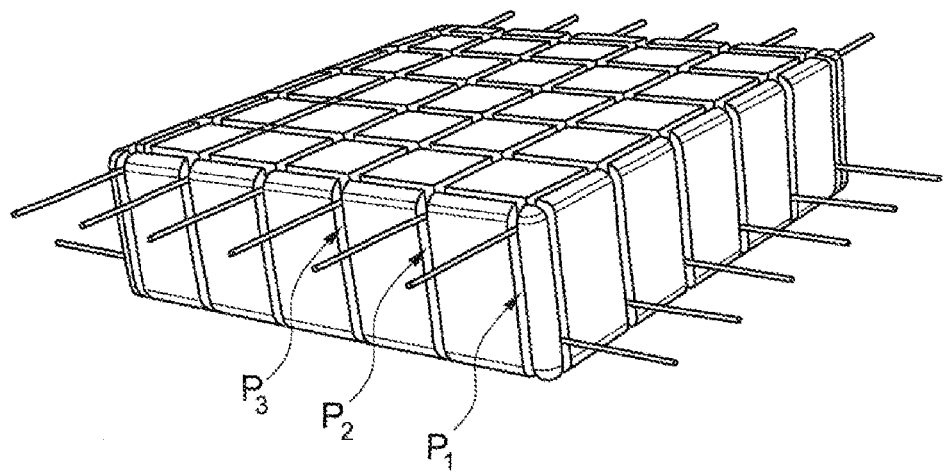
FIG. 7 represents, in 3-D view, the production of bricks from a Gen5-type lingot along the planes P ($P_1$, $P_2$, $P_3$, . . . )

Such cutting is represented schematically in FIG. 7.

The silicon wafers may then be produced from these bricks, according to conventional techniques known to a person skilled in the art, especially by cutting of the bricks, rectification of the faces, trimming of the top and bottom ends in order to adjust the dimensions of the wafer, etc.

These wafers of very high crystalline quality, having symmetrical grain boundaries or completely free of grain boundaries depending on the cutting variant used, may advantageously be used for producing photovoltaic cells, for example for homojunction or heterojunction systems.

The invention will now be described by means of the following examples given of course by way of nonlimiting illustration of the invention.

EXAMPLES

Example 1

(i) Seed Preparation

The seeds of first use are derived from Cz ingots. The chosen Cz ingot has a diameter of 9 inches (228.6 mm) and an orientation along Z of <100> (to within ±0.5°).

Knowing that it is desired to produce cells having a surface area of 156 (±0.5)×156 (±0.5) mm², the size of the seeds will be:

$$D_{seed} = D_{brick\ before\ rectification} + E_{wire} = 156.7 + 0.6 = 157.3\ \text{mm}$$

The Cz ingot is thus machined to give seeds having a surface area of 157.3×157.3 mm² and a thickness of 20 mm. The cutting is carried out with a rotation about the axis Z relative to a <100> 3 sided cubing reference position, in order to introduce a disorientation θ of the crystal lattice of the seeds, as represented schematically in FIG. 3.

The seeds removed are placed in the bottom of the crucible with a tiling as represented in FIG. 5, alternating a seed A, removed as it is from the Cz ingot, and a seed B, which has undergone, relative to the seed A, a rotation of 180° about the axis (x) or (y) as represented in FIG. 4, which makes it possible to obtain a total disorientation 2θ and therefore the desired symmetry between the seeds A and B.

(ii) Directional Growth of the Silicon by Seeded Regrowth

The crystallization furnace used for the crystallization by seeded regrowth is a furnace of "Gen 5" size (370 to 700 kg of feedstock) having three heating zones that are controlled in terms of temperature or power: a top heating zone, a bottom heating zone and a side heating zone.

A silicon ingot is formed in the crucible by the sequence of the following steps:
  directional melting of the silicon feedstock and partial melting of the seeds;
  growth by directional solidification; and
  cooling of the ingot.

(iii) Ingot Cutting

The ingot obtained is then cut into bricks in a "squarer" with a pitch of the wire guide of 157.3 mm and a cutting thickness of 600 μm per cutting line. The resulting bricks have a cross section of 156.7×156.7 mm² before rectification and of 156×156 mm² after 350 μm of rectification per face.

The wafers cut from such bricks are free of grain boundaries resulting from the seed boundaries.

Example 2

(i) Seed Preparation

The seeds of first use are derived from a Cz ingot. The chosen Cz ingot has a diameter of 9 inches (228.6 mm) and an orientation along Z of <100> (to within ±0.5°).

The Cz ingot is machined to give seeds having a cross section of 157.3×157.3 mm². The cutting is carried out with a rotation about the axis Z relative to a <100> 3 sided cubing reference position, in order to introduce a disorientation θ equal to 15° of the crystal lattice of the seeds, as represented schematically in FIG. 3.

A first tiling of four seeds is produced, according to the method illustrated in FIG. 4. A first seed, removed from the Cz ingot, is positioned in the bottom of the crucible. Next, a seed is selected from the same Cz ingot, which seed has the same orientation as the first seed and may therefore be considered to be identical to the first seed, and it is made to undergo a rotation of 180° about the axis (y) of the grid. The seed thus turned over, referred to as the second seed, is positioned in a manner contiguous and adjacent to the first seed along the axis (x) of the grid. In this way, the first and second seeds thus positioned have symmetrical crystal lattices and a total disorientation 2θ of 30°.

Next, a seed is selected from the same Cz ingot, which seed has the same crystallographic orientation as the first seed, and it is made to undergo a rotation of 180° about the axis (x). The seed thus turned over, referred to as the third seed, is positioned in a manner contiguous and adjacent to the first seed in the direction (y) of the grid. In this way, the first and third seeds thus positioned have symmetrical crystal lattices and a total disorientation 2θ of 30°.

Lastly, to complete the grid, a fourth seed is positioned. For this, a seed is selected from the same Cz ingot, which seed has the same orientation as the first seed, and it is made to undergo a rotation of 180° about the axis (y) then a rotation of 180° about the axis (x). The seed thus turned over, referred to as the fourth seed, is positioned in a manner contiguous and adjacent to the second seed in the direction (y) of the grid. In this way, the second and fourth seeds thus positioned are symmetrical and have a total disorientation 2θ of 30°.

(ii) Directional Growth of the Silicon by Seeded Regrowth

The crystallization furnace used for the crystallization by seeded regrowth is a furnace having three heating zones that are controlled in terms of temperature or power: a top heating zone, a bottom heating zone and a side heating zone.

A silicon ingot is formed in the crucible by the sequence of the following steps:
  directional melting of the silicon feedstock and partial melting of the seeds;
  growth by directional solidification; and
  cooling of the ingot.

Result

The ingot obtained has a height of 20 cm. It comprises columnar grains, which grew perpendicular to the surface of the seeds along the axis Z of the crucible. These grains are separated by grain boundaries which developed during the solidification from seed boundaries, then propagated along the direction Z, over the entire height of the ingot.

Observed along a direction normal to the upper surface of the ingot, the grain boundaries have not deviated substantially from the direction Z during the directional solidification. The deviation of a grain boundary observed at the top of the ingot in a horizontal plane is at most 4 mm.

It is pointed out that starting from the intersection of the seed boundaries of the four seeds, referred to as the quadruple junction, two triple junctions developed, the first triple junction defining a boundary between the first, second and fourth grains, the second triple junction defining a border between the first, third and fourth grains. The triple junctions, known to a person skilled in the art as being able to develop in an unstable manner during the growth of a silicon ingot, remained close to the quadruple junction from which they are derived, and did not move away therefrom. Neither do they generate significant deviation from the linearity of the grain boundaries.

(iii) Ingot Cutting

The ingot obtained is then cut into bricks in a "squarer" with a pitch of the wire guide of 157.3 mm. The wafers cut from such bricks are free of grain boundaries resulting from the seed boundaries.

Example 3

A tiling of G5 type comprising 36 seeds having a thickness of 25 mm is prepared according to the method described in point (i) of example 1. This tiling comprises 25 seeds having dimensions of 144 mm×144 mm forming a square grid of seeds, 10 seeds having dimensions of 144 mm×65 mm and 1 seed having dimensions of 65 mm×65 mm. The seeds forming the tiling are thus such that two adjacent seeds of the tiling have a total disorientation 2θ of 30°.

The crystallization furnace used for the crystallization by seeded regrowth is a furnace having three heating zones that are controlled in terms of temperature or power: a top heating zone, a bottom heating zone and a side heating zone. The directional solidification procedure is carried out according to the steps described for example 2.

Result

An ingot having a height of 275 mm and a square cross section of 840×840 mm² is thus obtained. It has symmetrical grain boundaries separating grains of columnar shape of axis Z.

Wafers are cut from this ingot and have dimensions of 156 mm×156 mm so as to comprise at least one grain boundary. In this way, by cutting the ingot at various heights, it is possible to measure the position of a specific grain boundary resulting from a seed boundary at various heights of the ingot.

Thus, wafers comprising four grains, the grain boundaries of which join together at a quadruple junction, were extracted at various heights of the ingot. The observation of these wafers confirms a substantially constant position of the quadruple junction and of the four grain boundaries over the height of the ingot. The grain boundaries are therefore substantially vertical across the thickness of the ingot.

Figure 8:
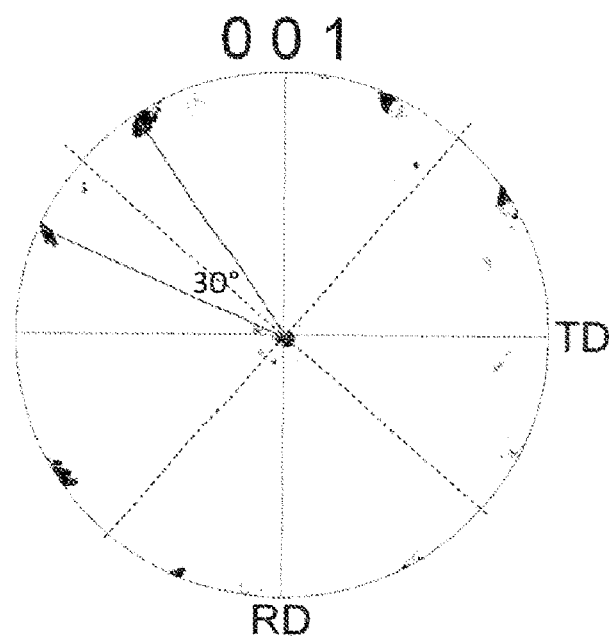
FIG. 8 represents a (001) pole figure of a wafer cut from an ingot obtained by a process according to the invention and comprising four grains, two adjacent grains having a crystalline symmetry relationship relative to the grain boundary that separates them.

Furthermore, as can be observed in FIG. 8 which represents a (001) pole figure of a wafer comprising four grains, the relationships of crystalline symmetry between the adjacent grains are respected and retained at mid-height of the ingot.

The pole figure of FIG. 8 was obtained by virtue of 9 EBSD mappings each established over a measurement zone having a size of 1.8 mm×1.8 mm. The measurement zones are chosen so as to encompass the quadruple junction where the four grain boundaries of the wafer join together.

On such a pole figure, the positions of the various normals to the planes (100) of the elementary cubic lattice of the silicon crystal forming the wafer are observed, within a point of reference linked to the measurement device. In FIG. 8, the axes (TD) and (RD) correspond to measurement directions perpendicular to one another and located in the plane of the wafer. The direction along the thickness of the wafer ((ND) direction) corresponds to the axis normal to the pole figure passing through the center of this figure.

Thus, on this pole figure, the four grains of the wafer have a <100> direction along the thickness of the wafer. Moreover, the grain boundaries are positioned angularly at an angle of 40° about the (ND) direction in the clockwise direction relative to the measurement axes (TD; RD).

It is thus possible to verify that two adjacent boundaries each have a disorientation of 15° relative to the grain boundary that separates them and that the crystalline disorientation between the two adjacent grain boundaries is equal to 30°.

The invention claimed is:

1. A process for manufacturing a silicon ingot, having symmetrical grain boundaries, comprising at least the steps consisting of:
    (i) providing a crucible of longitudinal axis (Z), the bottom of which comprises a tiling formed from monocrystalline silicon seeds of square- or rectangular-based straight block shape, said monocrystalline silicon seeds being positioned contiguously, said tiling seen along the axis (Z) being in the form of a grid having orthogonal directions (x) and (y) parallel to the edges of the seeds; and
    (ii) carrying out the directional solidification of silicon by seeded regrowth in a growth direction collinear to the axis (Z);

characterized in that the tiling in step (i) is produced from identical silicon seeds, with two adjacent seeds along the direction (x) being images of one another by a turning over in axis (y) and two adjacent seeds along the direction (y) being images of one another by a turning over in axis (x), and the disorientation 2θ between the crystal lattices of two adjacent seeds being greater than 4°.

2. The process as claimed in claim 1, wherein the thickness (e) of the seeds along the axis (Z) are greater than or equal to 5 mm.

3. The process as claimed in claim 1, wherein the disorientation 2θ between the crystal lattices of two adjacent seeds is greater than or equal to 5°.

4. The process as claimed in claim 1, wherein the crystal lattice of a seed has a direction collinear to the axis (Z).

5. The process as claimed in claim 1, wherein the crystal lattice of a seed has a <100> direction collinear to the axis (Z).

6. The process as claimed in claim 1, wherein the seeds are derived from a Cz silicon lingot; or from the recycling of an ingot formed according to the process as claimed in claim 1.

7. A silicon ingot having symmetrical grain boundaries, obtained according to the process of claim 1.

8. The ingot as claimed in claim 6, having a height measured along the growth axis (Z) of greater than or equal to 100 mm.

9. A process for manufacturing monocrystalline silicon wafers free of grain boundaries, comprising a step (iii) of cutting a silicon ingot as defined in claim 6, into bricks, by cutting along the planes P.

10. The process as claimed in claim 9, wherein the cutting are carried out using a cutting wire or a bandsaw.

\* \* \* \* \*